US010353223B2

(12) United States Patent
Kim et al.

(10) Patent No.: US 10,353,223 B2
(45) Date of Patent: Jul. 16, 2019

(54) BACKLIGHT ASSEMBLY AND DISPLAY DEVICE INCLUDING THE SAME

(71) Applicant: SAMSUNG DISPLAY CO., LTD., Yongin-si, Gyeonggi-Do (KR)

(72) Inventors: Dong Hoon Kim, Suwon-si (KR); Dong Hyeon Lee, Seoul (KR); Seung Hwan Baek, Seoul (KR); Ju Young Yoon, Seoul (KR); Han Moe Cha, Seoul (KR); Young Jun Choi, Yongin-si (KR)

(73) Assignee: SAMSUNG DISPLAY CO., LTD., Yongin, Gyeonggi-Do (KR)

(*) Notice: Subject to any disclaimer, the term of this patent is extended or adjusted under 35 U.S.C. 154(b) by 0 days.

(21) Appl. No.: 15/384,905

(22) Filed: Dec. 20, 2016

(65) Prior Publication Data

US 2017/0102586 A1 Apr. 13, 2017

Related U.S. Application Data

(63) Continuation of application No. 14/320,746, filed on Jul. 1, 2014.

(30) Foreign Application Priority Data

Feb. 5, 2014 (KR) .......................... 10-2014-0013116

(51) Int. Cl.
*F21V 9/40* (2018.01)
*G02F 1/1335* (2006.01)
(Continued)

(52) U.S. Cl.
CPC ...... *G02F 1/0105* (2013.01); *G02F 1/133602* (2013.01); *G02F 1/133603* (2013.01);
(Continued)

(58) Field of Classification Search
CPC ... G02F 2001/133614; G02F 1/133602; G02B 6/0026; F21V 9/40
See application file for complete search history.

(56) References Cited

U.S. PATENT DOCUMENTS 8,044,570 B2 * 10/2011 Oyaizu .................... F21V 9/16
313/501
8,469,530 B2 6/2013 Ito et al.
(Continued)

FOREIGN PATENT DOCUMENTS

| JP | 2003-046134 | 2/2003 |
|---|---|---|
| JP | 2005-093681 | 4/2005 |

(Continued)

OTHER PUBLICATIONS

Office Action (dated Jun. 5, 2018) issued by the JPO for Japanese patent application No. 2014-171343 which was filed Aug. 26, 2014. (3 pages in Japanese).

(Continued)

*Primary Examiner* — Ismael Negron
*Assistant Examiner* — Eric T Eide
(74) *Attorney, Agent, or Firm* — F. Chau & Associates, LLC

(57) ABSTRACT

A backlight assembly includes a light source portion including a plurality of light sources. The light sources are configured to emit light. A wavelength conversion member is disposed on the light source portion. The wavelength conversion member is configured to convert a wavelength of light emitted from the light source portion. The wavelength conversion member includes a first substrate disposed on the light source portion, a second substrate disposed on the first substrate, and a plurality of wavelength conversion layers interposed between the first substrate and the second sub- (Continued)

strate. Each of the plurality of wavelength conversion layers correspond to a light source of the plurality of light sources.

15 Claims, 22 Drawing Sheets

(51) Int. Cl.
  *G02F 1/01* (2006.01)
  *H01L 33/50* (2010.01)
  *B82Y 20/00* (2011.01)

(52) U.S. Cl.
  CPC ............ *H01L 33/504* (2013.01); *B82Y 20/00* (2013.01); *G02F 1/133606* (2013.01); *G02F 2001/133614* (2013.01); *G02F 2202/10* (2013.01); *G02F 2202/36* (2013.01); *Y10S 977/95* (2013.01)

(56) References Cited

U.S. PATENT DOCUMENTS

| | | | |
|---|---|---|---|
| 8,870,617 B2* | 10/2014 | Harbers | ............ F21V 9/16 445/1 |
| 8,957,442 B2 | 2/2015 | Seo et al. | |
| 2006/0072315 A1 | 4/2006 | Han et al. | |
| 2009/0039375 A1* | 2/2009 | LeToquin | ............ H01L 33/504 257/98 |
| 2009/0101930 A1 | 4/2009 | Li | |
| 2009/0140630 A1* | 6/2009 | Kijima | ............ C09K 11/661 313/498 |
| 2009/0152574 A1 | 6/2009 | Wang et al. | |
| 2011/0309325 A1 | 12/2011 | Park et al. | |
| 2012/0250304 A1* | 10/2012 | Harbers | ............ F21K 9/54 362/231 |
| 2013/0114301 A1 | 5/2013 | Um | |
| 2013/0249388 A1 | 9/2013 | Ryowa et al. | |
| 2014/0160728 A1 | 6/2014 | Kim et al. | |
| 2014/0176857 A1* | 6/2014 | Chen | ............ G02F 1/133621 349/61 |
| 2015/0219936 A1 | 8/2015 | Kim et al. | |
| 2015/0261076 A1* | 9/2015 | Dijken | ............ H01L 33/507 359/326 |

FOREIGN PATENT DOCUMENTS

| | | |
|---|---|---|
| JP | 2009-158462 | 7/2009 |
| JP | 2009-283438 | 12/2009 |
| JP | 2010-062456 | 3/2010 |
| JP | 2013-197530 | 9/2013 |
| JP | 2013-243052 | 12/2013 |

OTHER PUBLICATIONS

Office Action (dated May 4, 2018) issued by the CIPO for Chinese patent application No. 201410709509.3 which was filed Nov. 28, 2014 (7 pages).

Office Action (dated Feb. 26, 2019) issued by the JPO for Japanese patent application No. 2014-171343. (4 pages in Japanese).

* cited by examiner

BACKLIGHT ASSEMBLY AND DISPLAY DEVICE INCLUDING THE SAME

CROSS-REFERENCE TO RELATED APPLICATION

This application is a continuation of U.S. application Ser. No. 14/320,746, filed on Jul. 1, 2014, which claims priority under 35 U.S.C. § 119 to Korean Patent Application No. 10-2014-0013116, filed on Feb. 5, 2014 in the Korean Intellectual Property Office, the disclosure of which is incorporated by reference herein in its entirety.

TECHNICAL FIELD

Exemplary embodiments of the present invention relate to a backlight assembly, and more particularly to a backlight assembly and a display device including the same.

DISCUSSION OF RELATED ART

A display device may be used to display image data. The display device may be a liquid crystal display, an electrophoretic display, an organic light emitting display, an inorganic electroluminescent (EL) display, a field emission display, a surface-conduction electron-emitter display, a plasma display, or a cathode ray display, for example.

A liquid crystal display may include a liquid crystal layer disposed between two transparent substrates, and light permeability for each pixel may be adjusted according to a driving voltage applied to the liquid crystal layer to display a desired image.

A light source may be installed in the liquid crystal display, and contrast may be implemented by adjusting the strength of light that passes through liquid crystals included in each pixel. A backlight assembly including a light source portion may influence picture quality, such as luminance and uniformity of the liquid crystal device.

SUMMARY

A wavelength of light that is emitted from a light source portion may be converted by quantum dots. Each of the quantum dots may be a nano-size semiconductor material that has a quantum confinement effect. The quantum dot may generate stronger light than phosphor in a narrow wavelength range, and using the quantum dots, the color purity of light that is emitted from the light source portion can be increased.

Quantum dots may be integrally disposed on a front surface of the light source portion.

Exemplary embodiments of the present invention provide a backlight assembly, which may include one or more quantum dots, and may include a wavelength conversion member.

According to an exemplary embodiment of the present invention, a backlight assembly includes a light source portion including a plurality of light sources. The light source portion is configured to emit light. A wavelength conversion member is disposed on the light source portion. The wavelength conversion member is configured to convert a wavelength of light emitted from the light source portion. The wavelength conversion member includes a first substrate disposed on the light source portion, a second substrate disposed on the first substrate, and a plurality of wavelength conversion layers interposed between the first substrate and the second substrate. Each of the plurality of wavelength conversion layers correspond to a light source of the plurality of light sources.

The plurality of wavelength conversion layers may comprise quantum dots.

At least one of the first substrate and the second substrate may include a plurality of recess patterns. Each of the plurality of recess patterns may be disposed on a corresponding light source of the plurality of light sources. The plurality of wavelength conversion layers may be disposed in the plurality of recess patterns.

A plane that connects centers of each of the plurality of light sources to each other may be parallel to a plane that connects centers of each of the plurality of wavelength conversion layers.

A plurality of supports may be disposed between the plurality of wavelength conversion layers and the light source portion.

The wavelength conversion member may include a plurality of optical patterns disposed on at least one of the first substrate and the second substrate.

The plurality of optical patterns may be disposed on the plurality of wavelength conversion layers, but not on an area surrounding the plurality of wavelength conversion layers.

At least one of the first substrate and the second substrate may include a plurality of diffusion beads disposed therein.

A thickness of each of the plurality of wavelength conversion layers may be greater toward a center part of the plurality of light sources.

Each of the plurality of wavelength conversion layers may be disposed on center parts of the corresponding light sources of the plurality of light sources, and not on edge parts of the light sources of the plurality of light sources.

Each of the plurality of wavelength conversion layers may include a plurality of sub-wavelength conversion layers that are spaced apart from each other.

According to an exemplary embodiment of the present invention, a backlight assembly includes a plurality of light sources configured to emit light, and a plurality of wavelength conversion members. Each of the wavelength conversion members may be disposed between the plurality of light sources. Each of the plurality of wavelength conversion members may be configured to convert a wavelength of light emitted from the plurality of light sources. Each of the wavelength conversion members of the plurality of wavelength conversion members includes a first substrate, a second substrate disposed on the first substrate, and a wavelength conversion layer interposed between the first substrate and the second substrate.

The wavelength conversion layer may include quantum dots.

The first substrate may include a recess pattern, and the wavelength conversion layer may be disposed in the recess pattern.

Each of the plurality of light sources may be disposed on the same plane. An interface between the wavelength conversion layer and the second substrate may be perpendicular to a plane on which each of the plurality of light sources is disposed.

A height of each of the plurality of wavelength conversion members may be greater than a height of each of the plurality of light sources.

The plurality of light sources may be disposed in a matrix. Each of the plurality of wavelength conversion members may be disposed between adjacent rows or adjacent columns of the matrix.

According to an exemplary embodiment of the present invention, a display device includes a display panel configured to display an image, and a backlight assembly configured to provide light to the display panel. The backlight assembly includes a light source portion including a plurality of light sources configure to emit light that is provided to the display panel. A wavelength conversion member is disposed on the light source portion. The wavelength is configured to convert a wavelength of light emitted from the light source portion. The wavelength conversion member includes a first substrate disposed on the light source portion, a second substrate disposed on the first substrate, and a plurality of wavelength conversion layers interposed between the first substrate and the second substrate. Each of the plurality of wavelength conversion layers corresponds to a light source of the plurality of light sources.

Each of the plurality of wavelength conversion layers may include quantum dots.

At least one of the first substrate and the second substrate may include a plurality of recess patterns disposed on the plurality of light sources. The plurality of wavelength conversion layers may be disposed in the plurality of recess patterns.

BRIEF DESCRIPTION OF THE DRAWINGS

The above and other features of the present invention will become more apparent by describing in detail exemplary embodiments thereof, with reference to the accompanying drawings in which.

DETAILED DESCRIPTION OF THE DRAWINGS

Figure 1:
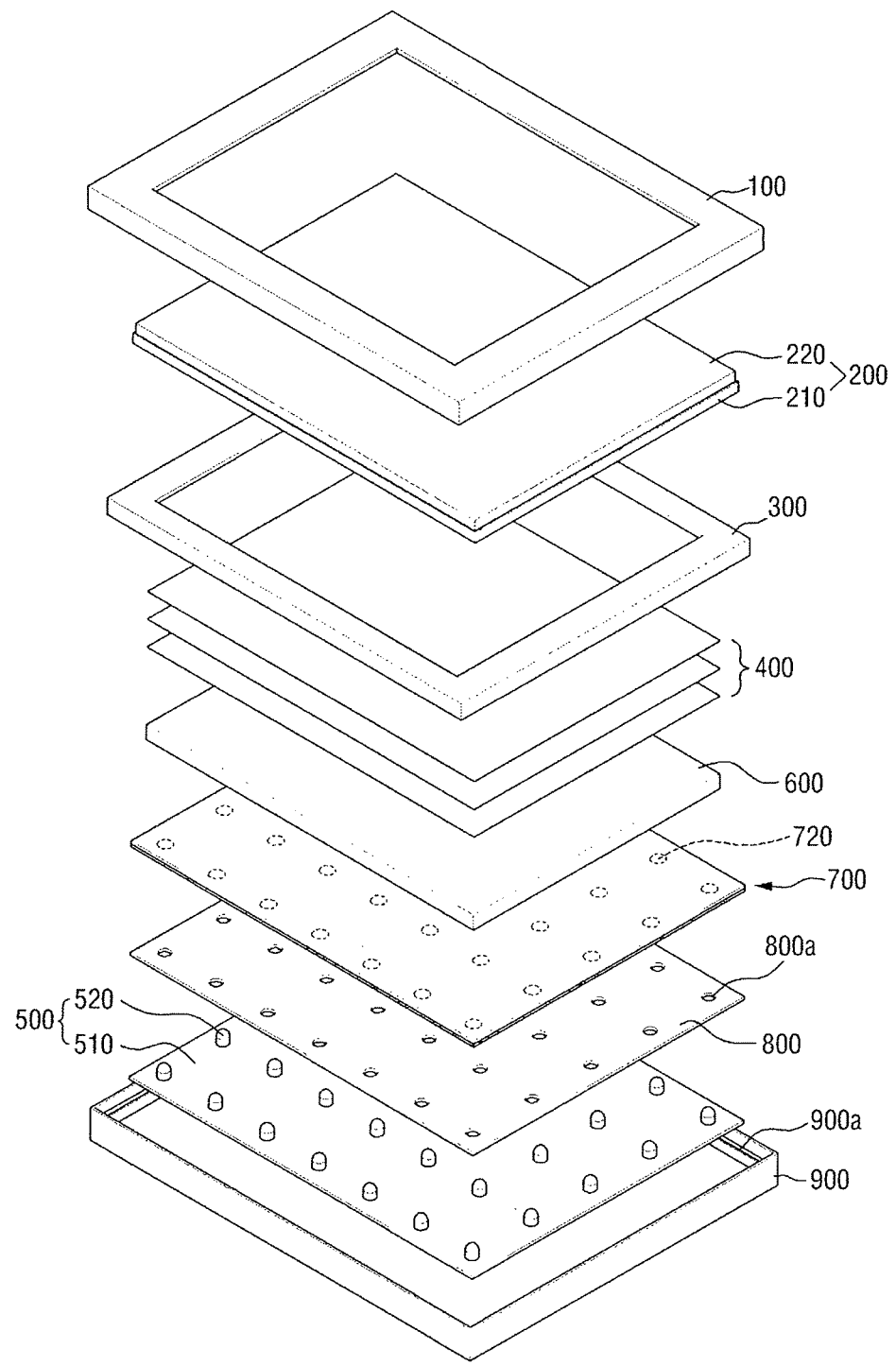
FIG. 1 is an exploded perspective view of a display device according to an exemplary embodiment of the present invention.

The present invention and methods of accomplishing the same may be better understood by reference to the following detailed description of exemplary embodiments and the accompanying drawings. The present invention may, however, be embodied in many different forms and should not be construed as being limited to the exemplary embodiments set forth herein. Like numbers may refer to like elements throughout. In the drawings, the thickness of layers and regions may be exaggerated for clarity.

It will be understood that when an element or layer is referred to as being "on" or "connected to" another element or layer, it may be directly on or connected to the other element or layer or intervening elements or layers may be present. Hereinafter, exemplary embodiments of the present invention will be described in more detail with reference to the accompanying drawings.

FIG. 1 is an exploded perspective view of a display device according to an exemplary embodiment of the present invention. Referring to FIG. 1, a display device according to an exemplary embodiment of the present invention may include a display panel 200 and a backlight assembly. The display device according to an exemplary embodiment of the present invention may include a top chassis 100 and a bottom chassis 900.

The display panel 200 may display an image, and the display panel 200 may be a liquid crystal display (LCD) panel, an electrophoretic display panel, an organic light emitting diode (OLED) panel, a light emitting diode (LED) panel, an inorganic electroluminescent (EL) display panel, a field emission display (FED) panel, a surface-conduction electron-emitter display (SED) panel, a plasma display panel (PDP), or a cathode ray tube (CRT) display panel. Hereinafter, as a display device according to an exemplary embodiment of the present invention, an LCD panel is exemplified, and as a display panel 200, an LCD panel is exemplified. However, the display device and the display panel according to exemplary embodiments of the present invention are not limited thereto, and various types of display devices and display panels may be used.

The display panel 200 may include a display region where an image is displayed and a non-display region where an image is not displayed. The display panel 200 may include a first display substrate 210, a second display substrate 220 that faces the first display substrate 210, and a liquid crystal layer (not illustrated) interposed between the first display substrate 210 and the second display substrate 220.

The first display substrate 210 and the second display substrate 220 may have a cuboidal shape. For example, FIG. 1 illustrates the first display substrate 210 and the second display substrate 220 in the cuboidal shape. However, the shape of the first display substrate 210 and the second display substrate 220 is not limited thereto, and the first display substrate 210 and the second display substrate 220 may be manufactured in various shapes according to the shape of the display panel 200.

The liquid crystal layer may be interposed between the first display substrate 210 and the second display substrate 220. Between the first display substrate 210 and the second display substrate 220, a sealing member (not illustrated), such as a sealant, may be disposed along edge portions of the first display substrate 210 and the second display substrate 220 to attach and seal the first display substrate 210 and the second display substrate 220.

Although not illustrated in FIG. 1, the display panel 200 may include a driving portion and a flexible circuit board, which may be attached to the first display substrate 210 or the second display substrate 220. The driving portion may apply driving signals that display an image on the display region to elements on the display region. The flexible circuit board may be connected to an external control device and a power supply to apply various external signals to the driving portion.

The backlight assembly may be disposed on a lower part of the display panel 200. The backlight assembly may provide light to the display panel 200. The backlight assembly according to an exemplary embodiment of the present invention may include a light source portion 500 and a wavelength conversion member 700. The backlight assembly according to an exemplary embodiment of the present invention may include a diffusion plate 600, an optical sheet 400, a reflective plate 800, and a mold frame 300.

The light source portion 500 may overlap a surface of the display panel 200. The backlight assembly according to an exemplary embodiment of the present invention may be a direct type backlight assembly, and the light source portion 500 may overlap the display region of the display panel 200. The light source portion 500 may emit light that is provided to the display panel 200.

The light source portion 500 may include a circuit board 510 and a plurality of light sources 520.

The circuit board 510 may be interposed between the diffusion plate 600 and a bottom chassis 900 and may support the plurality of light sources 520 and transfer voltages and various signals to the plurality of light sources 520. The circuit board 510 may have a cuboidal plate shape, and may be connected to the flexible circuit board to receive a dimming signal from the driving portion.

The plurality of light sources 520 may be mounted on the circuit board 510. The plurality of light sources 520 may receive voltages from an outside source to generate light that is provided to the display panel 200.

The light sources of the plurality of light sources 520 may be disposed on the same plane. According to an exemplary embodiment of the present invention, the light sources of the plurality of light sources 520 may be disposed on a plane that is parallel to a lower surface of the diffusion plate 600. The light sources of the plurality of light sources 520 may be Light Emitting Diodes (LEDs), but are not limited thereto. The plurality of light sources 520 may include any device that can emit light. According to an exemplary embodiment of the present invention, the light sources of the plurality of light sources 520 may be disposed in the form of a matrix, but are not limited thereto. The positions of the light sources of the plurality of light sources 520 may be modified depending on the shape of the display panel 200.

Each of the light sources of the plurality of light sources 520 may emit blue light. According to an exemplary embodiment of the present invention, the plurality of light sources 520 may be blue light emitting diodes including gallium nitride semiconductors, but are not limited thereto. The plurality of light sources 520 may include any device that can emit blue light.

Each of the light sources of the plurality of light sources 520 may include a top emitting type lens. For example, light emitted from the plurality of light sources 520 may be emitted in an upper direction of the plurality of light sources 520. For example, the backlight assembly according to an exemplary embodiment of the present invention may be a top view type backlight assembly.

The wavelength conversion member 700 may be disposed on the light source portion 500. The wavelength conversion member 700 may be interposed between the display panel 200 and the light source portion 500. The light conversion member 700 may convert the wavelength of the light emitted from the light source portion 500. For example, the light emitted from the light source portion 500 may be converted into light having a relatively long wavelength when passing through the wavelength conversion member 700, and the converted light may be provided to the display panel 200. For example, the color of the converted light may be white. The wavelength conversion member 700 is described in more detail below.

The diffusion plate 600 may be disposed on the wavelength conversion member 700. The diffusion plate 600 may be disposed between the wavelength conversion member 700 and the display panel 200. The diffusion plate 600 may increase the luminance uniformity of light that is emitted from the light source portion 500.

The optical sheet 400 may be disposed on an upper part of the diffusion plate 600. The optical sheet 400 may be disposed between the display panel 200 and the diffusion plate 600. The optical sheet 400 may modulate the optical characteristics of light that is emitted from the light source portion 500 and passes through the diffusion plate 600. A plurality of optical sheets 400 may overlap each other. The plurality of optical sheets 400 may be stacked to supplement each other. For example, the optical sheets 400 may include a prism sheet and the like.

The reflective plate 800 may be disposed on a lower side of the diffusion plate 600. The reflective plate 800 may be interposed between the diffusion plate 800 and the light source portion 500. The reflective plate 800 may change a path of light, which is emitted from the light source portion 500 and travels in the direction of the bottom chassis 900, to the direction of the diffusion plate 600.

The reflective plate 800 may include a plurality of insertion holes 800a. The plurality of insertion holes 800a may correspond to the plurality of light sources 520, respectively. For example, the plurality of light sources 520 may be disposed in the plurality of insertion holes 800a, respectively.

The mold frame 300 may be disposed between the display panel 200 and the optical sheet 400. The mold frame 300 may be attached to the bottom chassis 900 to fix the optical sheet 400, the light source portion 500, the diffusion plate 600, the wavelength conversion member 700, and the reflective plate 800. The mold frame 300 may contact the edge portion of the display panel 200 to support and fix the display panel 200.

The top chassis 100 may cover the edge of the display panel 200, and may surround the side surfaces of the display panel 200 and the backlight assembly. The bottom chassis 900 may be shaped to receive the backlight assembly. The top chassis 100 may be disposed on the bottom chassis 900 to surround the display panel 200 and the backlight assembly. The top chassis 100 and the bottom chassis 900 may include a conductive material, for example, a metal. The bottom chassis 900 may include a groove 900a in which the wavelength conversion member 700 is disposed. For example, the wavelength conversion member 700 may be inserted into the groove 900a that is formed on the inside of the bottom chassis 900 and may be stably fixed to the bottom chassis 900. The groove 900a may also be disposed on the mold frame 300.

Figure 2:
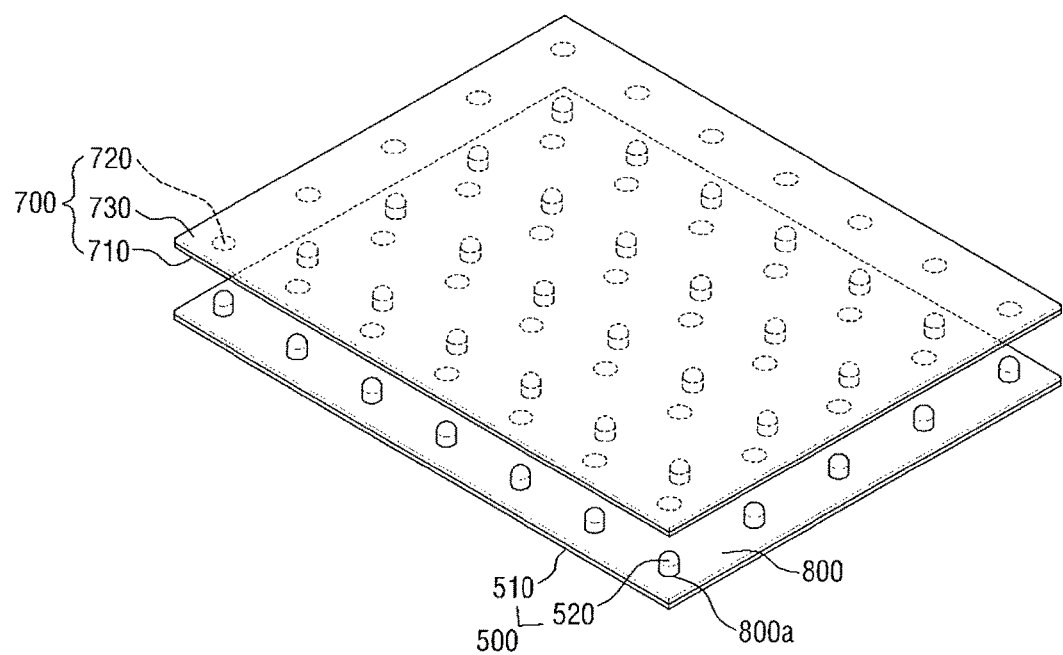
FIG. 2 is a perspective view of a backlight assembly of the display device of FIG. 1.
Figure 3:
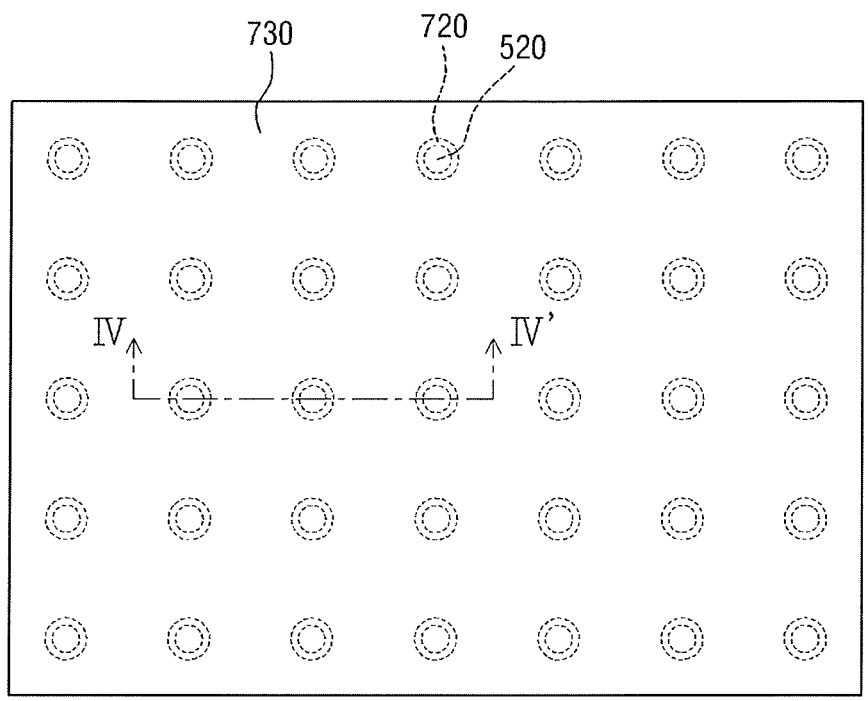
FIG. 3 is a plan view of the backlight assembly of FIG. 2.

Hereinafter, the backlight assembly according to an exemplary embodiment of the present invention will be described in more detail with reference to FIGS. 2 to 4. FIG. 2 is a perspective view of a backlight assembly of the display device of FIG. 1. FIG. 3 is a plan view of the backlight assembly of FIG. 2, and FIG. 4 is a cross-sectional view taken along line IV-IV' of FIG. 3.

Figure 4:
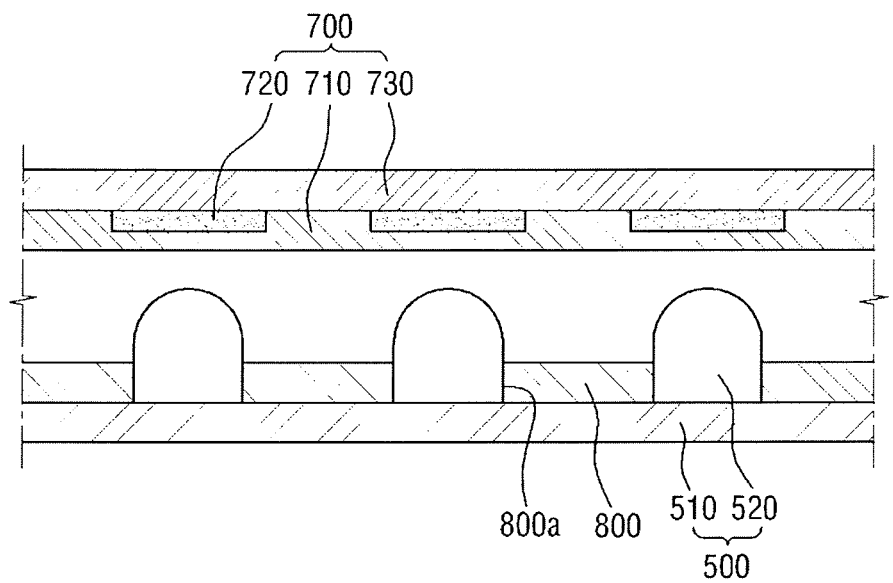
FIG. 4 is a cross-sectional view taken along line IV-IV' of FIG. 3.

Referring to FIGS. 2 to 4, the wavelength conversion member 700 that may be included in the backlight assembly according to an exemplary embodiment of the present invention may include a first substrate 710, a plurality of wavelength conversion layers 720, and a second substrate 730.

The first substrate 710 may be disposed on the light source portion 500. The first substrate 710 may be spaced apart from the light source portion 500 by a predetermined distance. The lower surface of the first substrate 710 may be substantially parallel to a surface of the circuit board 510 on which the plurality of light sources 520 are disposed. The first substrate 710 may cover all the light sources 520 included in the light source portion 500.

The first substrate 710 may include a material that can block moisture and oxygen. According to an exemplary embodiment of the present invention, the first substrate 710 may include an insulating material, for example, silicon oxide (SiOx), silicon nitride (SiNx), or a combination thereof. According to an exemplary embodiment of the present invention, the first substrate 710 may be a plastic film including polyethylene phthalate (PET) or polycarbonate (PC). According to an exemplary embodiment of the present invention, the first substrate 710 may include glass.

The first substrate 710 may include a plurality of recess patterns. The plurality of recess patterns may be disposed on an upper surface of the first substrate 710, that is, on a surface of the first substrate 710 that does not face the light source portion 500. According to an exemplary embodiment of the present invention, a recess pattern of the plurality of recess patterns may correspond to a light source of the plurality of light sources 520, but is not limited thereto. The recess patterns of the plurality of recess patterns may correspond to the light sources of the plurality of light sources 520.

A thickness of each of the recess patterns of the plurality of recess patterns may be about ¼ to ¾ of the thickness of the first substrate 710. According to an exemplary embodiment of the present invention, the thickness of each of the recess patterns of the plurality of recess patterns may be about ½ of the thickness of the first substrate 710. However, the thickness of each of the recess patterns of the plurality of recess patterns is not limited thereto, and may differ depending on the light sources 520 and the wavelength conversion layer 720.

The recess patterns of the plurality of recess patterns may each cover a corresponding light source of the plurality of light sources 520. According to an exemplary embodiment of the present invention, the center part of each of the recess patterns of the plurality of recess patterns may overlap the corresponding light source 520, and the edge part thereof need not overlap the corresponding light source 520. However, the position of each of the plurality of recess patterns is not limited thereto, and each of the plurality of recess patterns may completely overlap the corresponding light source 520.

A planar shape of each of the recess patterns of the plurality of recess patterns may be a circle, but is not limited thereto. The planar shape of each of the recess patterns of the plurality of recess patterns may be an ellipse or a polygon. The planar shape of each of the recess patterns of the plurality of recess patterns may be determined by the shape of the wavelength conversion layer 720 disposed therein.

The plurality of recess patterns may be formed through a photoresist process. For example, the first substrate 710 that may include the plurality of recess patterns may be manufactured by preparing a glass substrate or film before being processed, coating photoresist thereon, and then successively performing exposure, development, etching, and cleaning. However, the forming of the plurality of recess patterns is not limited thereto, and the first substrate 710 may be manufactured through an extruding process or imprinting process.

The plurality of wavelength conversion layers 720 may be disposed on the first substrate 710. The plurality of wavelength conversion layers 720 may be disposed in the plurality of recess patterns formed on the first substrate 710. According to an exemplary embodiment of the present invention, the plurality of wavelength conversion layers 720 may completely fill the plurality of recess patterns. Accordingly, the surface of the plurality of wavelength conversion layers 720 and an upper surface of the first substrate 710 of a portion where the plurality of recess patterns are not formed may be disposed on the same plane. A virtual plane that connects centers of the plurality of wavelength conversion layers 720 and a virtual plane that connects centers of the plurality of light sources 520 may be parallel to each other.

The width of each of the wavelength conversion layers of the plurality of wavelength conversion layers 720 may be equal to or larger than about 50% of the width of a light emitting region of the corresponding light source 520, but is not limited thereto. The width of each of the wavelength conversion layers of the plurality of wavelength conversion layers 720 may differ depending on the light source 520 and a total thickness of the plurality of wavelength conversion layers 720.

The plurality of wavelength conversion layers 720 may convert the wavelength of light into a relatively long wavelength. For example, the wavelength of light before passing through the plurality of wavelength conversion layers 720 may be longer than the wavelength of light after passing through the plurality of wavelength conversion layer 720.

The plurality of wavelength conversion layers 720 may include phosphor, quantum dots, or a combination thereof.

The phosphor may be a general organic or inorganic phosphor. According to an exemplary embodiment of the present invention, the phosphor may be yellow phosphor. The yellow phosphor may include a YAG phosphor material, a silicate phosphor material, an oxynitride phosphor material, or a combination thereof, but is not limited thereto.

The quantum dot may be a semiconductor nano-particle having a core-shell structure, and may have a diameter of several to several tens of nm. The quantum dot may emit different light depending on the size of the nano-particle by a quantum confinement effect. The quantum dot may emit relatively strong light in a relatively narrow wavelength range, and light emitted from the quantum dot may be emitted as unstable (unsteady) electrons that have recoiled from a conduction band to a valence band. For example, the quantum dot may emit light of a shorter wavelength as its particle becomes smaller, and may emit light of a longer wavelength as its particle becomes larger. Accordingly, through adjustment of the size of the quantum dots, visible light of a desired wavelength can be emitted.

The quantum dot may include a Si nanocrystal, II-IV group compound semiconductor nanocrystal, III-V group compound semiconductor nanocrystal, IV-VI group compound nanocrystal, or a mixture thereof.

The II-VI group compound semiconductor nanocrystal may be CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HggZnTe, CdZnSeS, CdZnSeTe, CdZnSTe, CdHgSeS, CdHgSeTe, CdHgSTe, HgZnSeS, HgZnSeTe, or HgZnSTe.

Further, the III-V group compound semiconductor nano crystal may be GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, or InAlPAs, and the IV-VI group compound semiconductor nanocrystal may be SbTe.

The plurality of wavelength conversion layers 720 may include a quantum dot. For example, the plurality of wavelength conversion layers 720 may include a yellow quantum dot that converts the wavelength of incident light into the wavelength of yellow light, but are not limited thereto. The plurality of wavelength conversion layers 720 may include two or more quantum dots. For example, the plurality of wavelength conversion layers 720 may include a red quantum dot that converts the wavelength of incident light into a wavelength of red light and a green quantum dot that converts the wavelength of incident light into a wavelength of green light.

The plurality of wavelength conversion layers 720 may include a dispersive medium that disperses a wavelength conversion material in addition to the wavelength conversion material, such as phosphor or quantum dots. For example, the phosphor or quantum dot may be dispersed in a state where the phosphor or quantum dot is dispersed in the dispersive medium, such as an organic solvent or polymer resin. The dispersive medium may be any transparent material which does not exert an influence on the wavelength conversion performance of the phosphor or quantum dot, does not reflect light, and does not absorb light.

The organic solvent may include, for example, chloroform, or ethanol, and the polymer resin may include, for example, epoxy, silicone, polystyrene, or acrylate.

The plurality of wavelength conversion layers 720 may include a UV initiator, thermosetting additives, a crosslinker, a diffuser, or a combination thereof. As described above, the wavelength conversion layer 720 may be disposed on the first substrate 710 in a state where the wavelength conversion material and the additives are mixed.

The plurality of wavelength conversion layers 720 may be formed by a dispensing process. According to an exemplary embodiment of the present invention, the wavelength conversion layers of the plurality of wavelength conversion layers 720 may be selectively spread in the recess patterns of the plurality of recess patterns by an inkjet printer.

The second substrate 730 may be disposed on the plurality of wavelength conversion layers 720. The second substrate 730 and the first substrate 710 may surround the plurality of wavelength conversion layers 720.

The second substrate 730 need not be patterned. For example, the second substrate 730 need not include patterns, such as the recess patterns that may be disposed on the first substrate 710.

The second substrate 730 may include a material that can intercept moisture and/or oxygen. According to an exemplary embodiment of the present invention, the second substrate 730 may include an insulating material, for example, silicon oxide (SiOx), silicon nitride (SiNx), or a combination thereof. According to an exemplary embodiment of the present invention, the second substrate 730 may be a plastic film and may include polyethylene phthalate (PET) or polycarbonate (PC). According to an exemplary embodiment of the present invention, the second substrate 730 may include glass. According to an exemplary embodiment of the present invention, the second substrate 730 may include a same material as the first substrate 710.

Although not illustrated, between the first substrate 710 and the second substrate 730, a sealing member, such as a sealant, may be disposed along edge portions of the first substrate 710 and the second substrate 730 to attach and seal the first substrate 710 and the second substrate 730. According to an exemplary embodiment of the present invention, the sealing member may be disposed between the first substrate 710 and the second substrate 730, but is not limited thereto. The sealing member may cover all side surfaces of the first substrate 710 and the second substrate 730 to protect the plurality of wavelength conversion layer 720 from external moisture and oxygen.

When the first substrate 710 and the second substrate 730 include rigid glass, the wavelength conversion member 700 may be formed by a process of forming the wavelength conversion layer 720 after patterning the first substrate 710 and attaching the second substrate 730 onto the wavelength conversion layer 720. When the first substrate 710 and the second substrate 730 include a flexible film material, the wavelength conversion member 700 may be formed by a lamination process.

In the backlight assembly of the display device according to an exemplary embodiment of the present invention, the wavelength conversion layers of the plurality of wavelength conversion layers 720 may each correspond to a light source of the plurality of light sources 520, respectively, and thus the color uniformity of light that is emitted to the diffusion plate 600 can be obtained. For example, when a wavelength conversion layer of the plurality of wavelength conversion layers 720 is disposed corresponding to a light source of the plurality of light sources 520, the wavelength of light that is emitted from the light source 520 may be converted, and a color stain between the adjacent light sources 520 can be reduced. According to an exemplary embodiment of the present invention, when the light source 520 emits blue light and the wavelength conversion layer 720 converts the color of light that is emitted from the light source 520 into white light, light which is emitted from the light source 520 and passes through the wavelength conversion member 700, may become a substantially uniform white light.

The wavelength conversion layer 720 might not be integrally formed on the front surface of the light source portion 500, but might be formed only on portions of the light source potion 500 that correspond to the light sources 520. For example, when the wavelength conversion layer 720 includes quantum dots, it may integrally form the wavelength conversion layer 720 on the front surface of the light source portion 500. Since the wavelength conversion member 700 according to an exemplary embodiment of the present invention may include the plurality of wavelength conversion layers 720 instead of one wavelength conversion layer 720 and the plurality of wavelength conversion layers 720 may be positioned on the portions that correspond to the plurality of light sources 520, respectively, the cost associated with fabricating the wavelength conversion layers 720 may be reduced.

When the wavelength conversion layers of the plurality of wavelength conversion layers 720 are disposed at desired positions, the process efficiency can be increased. When positioning the wavelength conversion layers of the plurality of wavelength conversion layers 720 on the patterned portions of the first substrate 710 after patterning the first substrate 710, the wavelength conversion layers of the plurality of wavelength conversion layers 720 can be formed at the desired positions without a separate guide.

Figure 5:
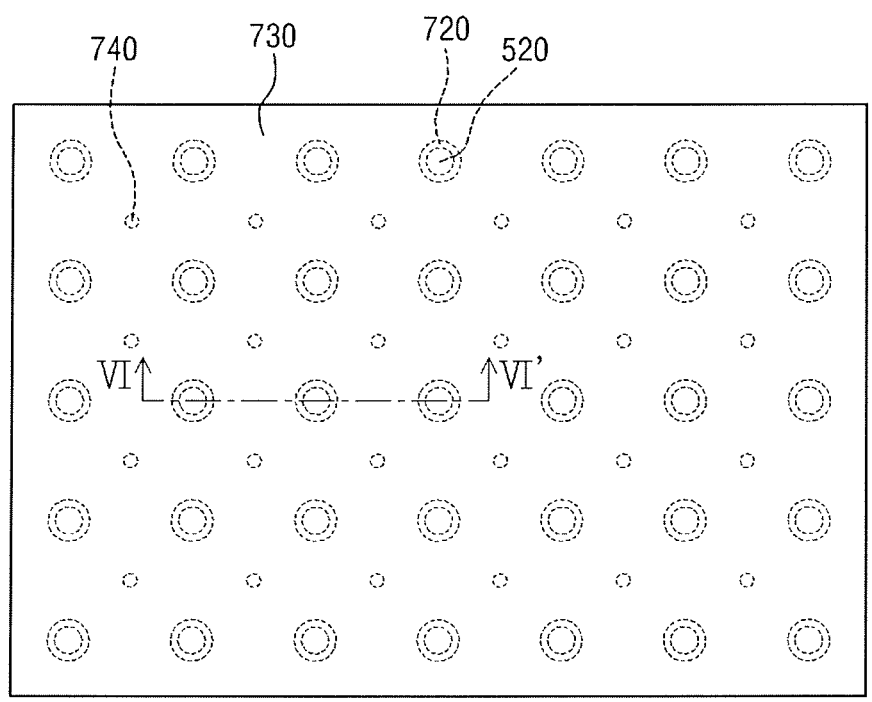
FIG. 5 is a plan view of a backlight assembly according to an exemplary embodiment of the present invention.
Figure 6:
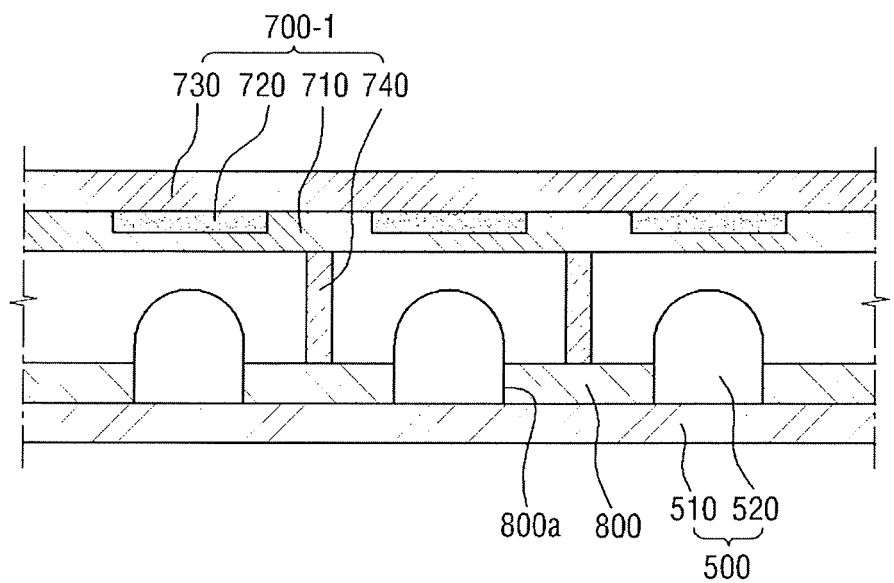
FIG. 6 is a cross-sectional view taken along line VI-VI' of FIG. 5.

FIG. 5 is a plan view of a backlight assembly according to an exemplary embodiment of the present invention, and FIG. 6 is a cross-sectional view taken along line VI-VI' of FIG. 5. The same reference numerals in FIGS. 5 and 6 may refer to substantially the same elements as the elements illustrated in the above-described drawings, and duplicate explanation thereof may be omitted.

Referring to FIGS. 5 and 6, a wavelength conversion member 700-1 may further include a plurality of supports 740. The plurality of supports 740 may be in direct contact with the lower surface of the first substrate 710 and the reflective plate 800 to maintain a distance between the plurality of wavelength conversion layers 720 and the plurality of light sources 520. For example, the plurality of supports 740 may fix the wavelength conversion member 700-1 to the groove 900a.

The plurality of supports 740 may be disposed in a matrix. According to an exemplary embodiment of the present invention, each of the plurality of supports 740 may be surrounded by four light sources 520, but is not limited thereto.

The plurality of supports 740 need not overlap the plurality of wavelength conversion layers 720. When the plurality of supports 740 do not overlap the plurality of wavelength conversion layers 720, they need not disturb the wavelength conversion function of the wavelength conversion member 700-1.

The plurality of supports 740 may include a heat-resistant resin, but are not limited thereto. The plurality of supports 740 may include a metal. The plurality of supports 740 may include a same material as that of the first substrate 710. The plurality of supports 740 may be integrally formed with the first substrate 710.

Figure 7:
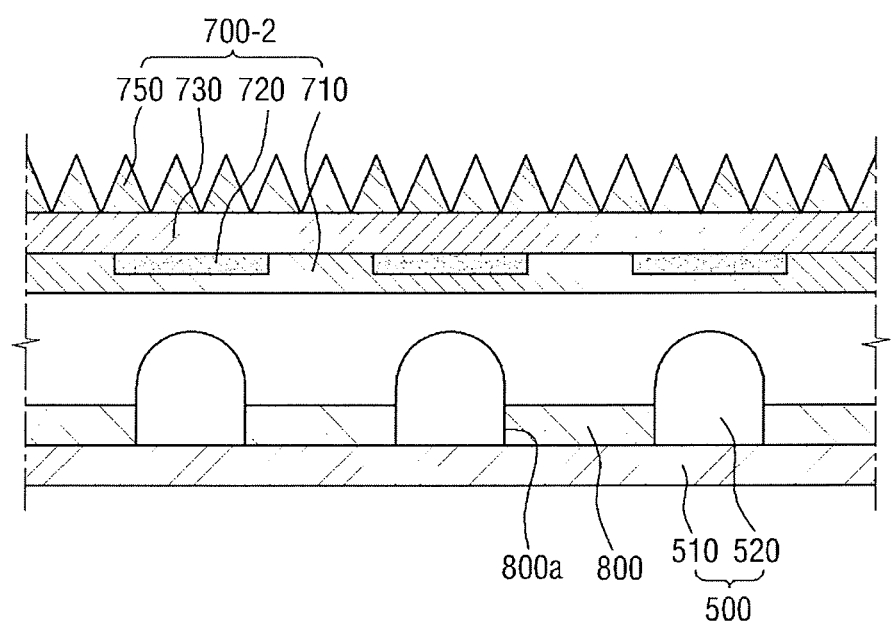
FIGS. 7 to 16 are cross-sectional views of backlight assemblies according to exemplary embodiments of the present invention.

FIG. 7 is a cross-sectional view of a backlight assembly according to an exemplary embodiment of the present invention. The same reference numerals in FIG. 7 may refer to substantially the same elements as the elements illustrated in the above-described drawings, and duplicate explanation thereof may be omitted.

Referring to FIG. 7, a wavelength conversion member 700-2 may include a plurality of optical patterns 750 formed on an upper surface of the second substrate 730. The plurality of optical patterns 750 may include prism patterns. The plurality of optical patterns 750 may be disposed on the front surface of the second substrate 730. The prism patterns may collect light emitted from the light source portion 500, but are not limited thereto. The plurality of optical patterns 750 may be disposed on the lower surface of the first substrate 710.

Figure 8:
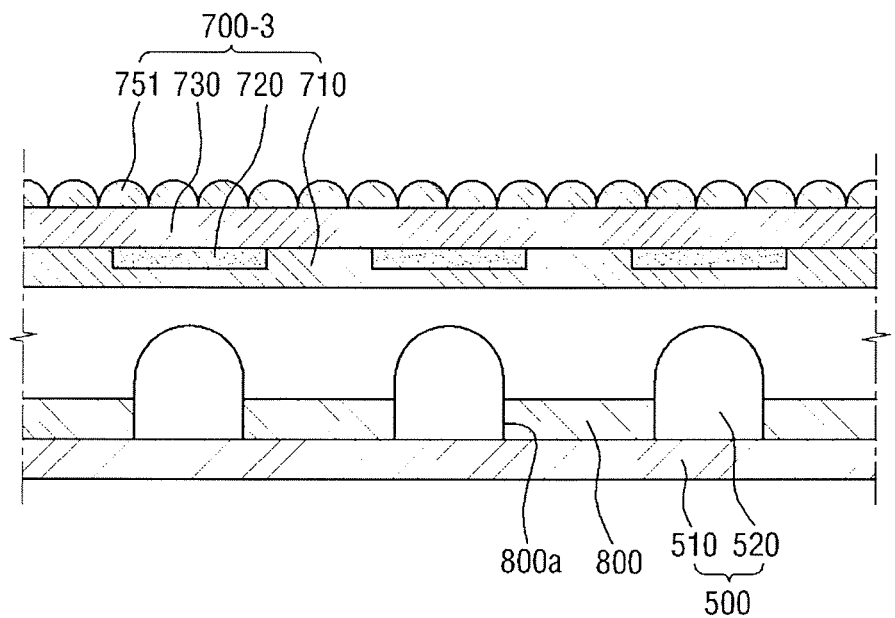

FIG. 8 is a cross-sectional view of a backlight assembly according to an exemplary embodiment of the present invention. The same reference numerals in FIG. 8 may refer to substantially the same elements as the elements illustrated in the above-described drawings, and duplicate explanation thereof may be omitted.

Referring to FIG. 8, a plurality of optical patterns 751 of a wavelength conversion member 700-3 may include micro lens patterns. The micro lens patterns may collect or diffuse the light emitted from the light source portion 500.

Figure 9:
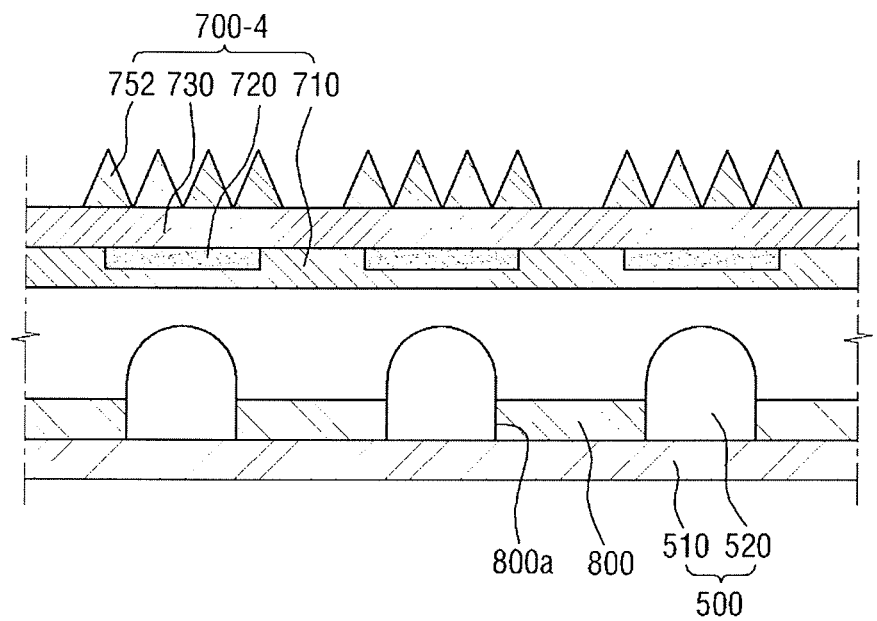

FIG. 9 is a cross-sectional view of a backlight assembly according to an exemplary embodiment of the present invention. The same reference numerals in FIG. 9 may refer to substantially the same elements as the elements illustrated in the above-described drawings, and duplicate explanation thereof may be omitted.

Referring to FIG. 9, a plurality of optical patterns 752 of a wavelength conversion member 700-4 may be formed on the wavelength conversion layer 720 rather than on a region surrounding the wavelength conversion layer 720. The plurality of prism patterns may be densely disposed on the wavelength conversion layer 720. Accordingly, properties of light emitted from the plurality of light sources 520 may be individually adjusted.

Figure 10:
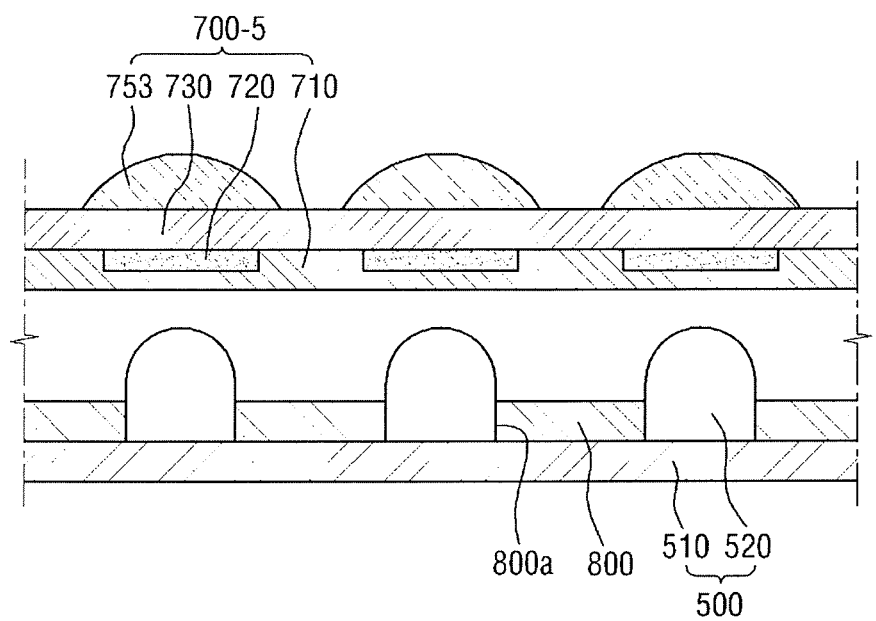

FIG. 10 is a cross-sectional view of a backlight assembly according to an exemplary embodiment of the present invention. The same reference numerals in FIG. 10 may refer to substantially the same elements as the elements illustrated in the above-described drawings, and duplicate explanation thereof may be omitted.

Referring to FIG. 10, a plurality of optical patterns 753 of a wavelength conversion member 700-5 may each correspond to a wavelength conversion layer of the plurality of wavelength conversion layers 720, respectively. For example, each optical pattern 753 may be disposed on a corresponding wavelength conversion layer 720. The optical pattern 753 may include a micro lens pattern.

Figure 11:
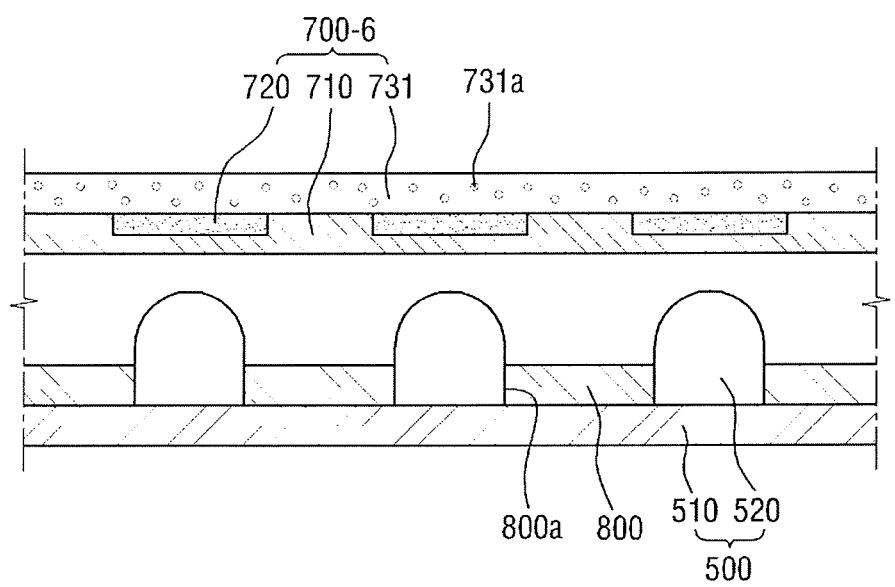

FIG. 11 is a cross-sectional view of a backlight assembly according to an exemplary embodiment of the present invention. The same reference numerals in FIG. 11 may refer to substantially the same elements as the elements illustrated in the above-described drawings, and duplicate explanation thereof may be omitted.

Referring to FIG. 11, a second substrate 731 of a wavelength conversion member 700-6 may include a plurality of diffusion beads 731a. For example, the plurality of diffusion beads 731a may be randomly dispersed in the second substrate 731. Accordingly, light, which may be emitted from the light source portion 500 and pass through the wavelength conversion layer 720, may be diffused as it passes through the second substrate 731. When the second substrate 731 is disposed on the first substrate 710, as described above, a thickness of a diffusion plate 600 may be reduced, or the diffusion plate 600 may be omitted. FIG. 11 illustrates that the plurality of diffusion beads 731a may be disposed in the second substrate 731, but the position of the diffusion beads is not limited thereto. The plurality of diffusion beads 731a may be disposed inside the first substrate 710 or inside both the first substrate 710 and the second substrate 731.

Figure 12:
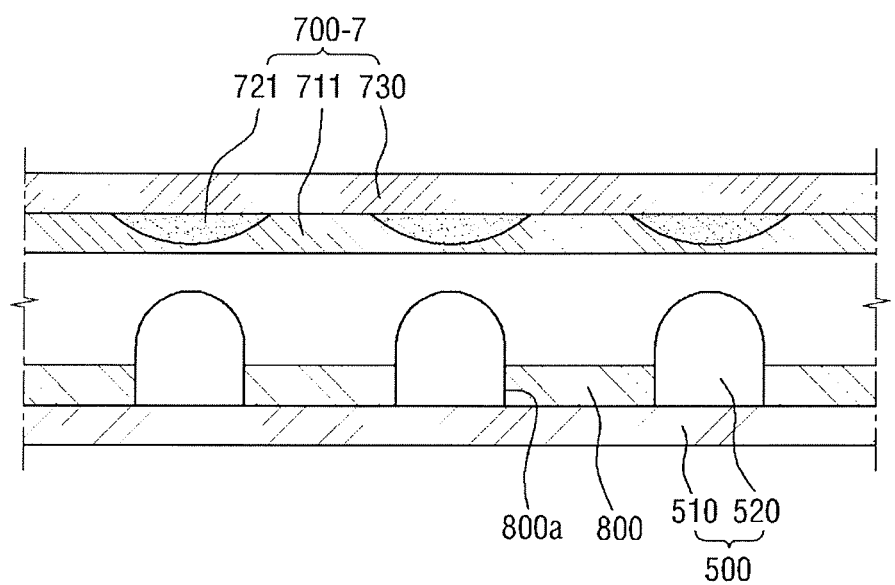

FIG. 12 is a cross-sectional view of a backlight assembly according to an exemplary embodiment of the present invention. The same reference numerals in FIG. 12 may refer to substantially the same elements as the elements illustrated in the above-described drawings, and duplicate explanation thereof may be omitted.

Referring to FIG. 12, a plurality of wavelength conversion layers 721 of a wavelength conversion member 700-7 need not have a constant thickness. According to an exemplary embodiment of the present invention, the thickness of each of wavelength conversion layers of the plurality of wavelength conversion layers 721 may increase toward center parts of each of the light sources of the plurality of light sources 520, respectively. The intensity of light that is emitted onto the wavelength conversion member 700-7 that is disposed on the center part of the light sources 520 may be higher than the intensity of light that is emitted onto the wavelength conversion member 700-7 that is disposed on the edge part of the light sources 520. By increasing the thickness of the wavelength conversion layer 721 on a portion to which light having a relatively high intensity is emitted and decreasing the thickness of the wavelength conversion layer 721 on a portion to which light having a relatively low intensity is emitted, the color uniformity of the light that passes through the wavelength conversion member 700-7 can be obtained. Accordingly, the shape of the recess pattern of a first substrate 711 may correspond to the shape of the wavelength conversion layer 721.

Figure 13:
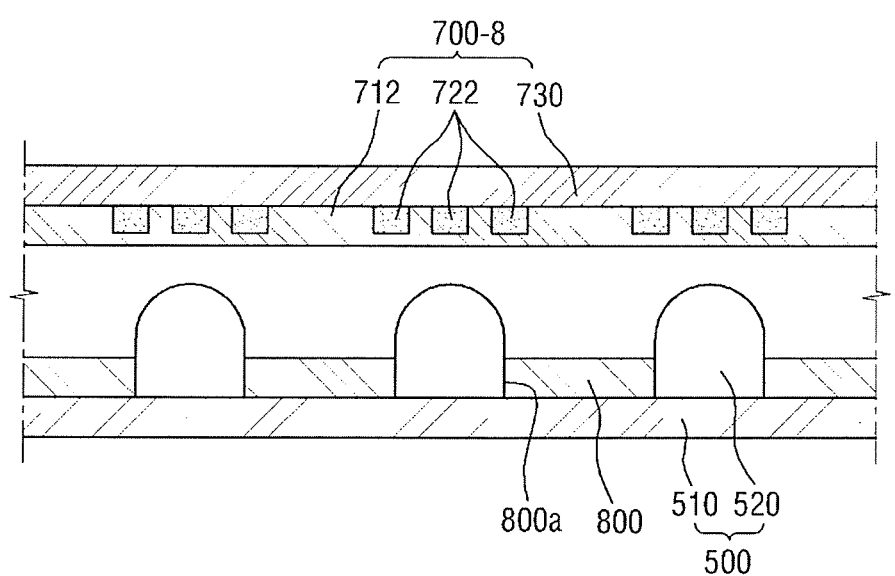

FIG. 13 is a cross-sectional view of a backlight assembly according to an exemplary embodiment of the present invention. The same reference numerals in FIG. 13 may refer to substantially the same elements as the elements illustrated in the above-described drawings, and duplicate explanation thereof may be omitted.

Referring to FIG. 13, a plurality of wavelength conversion layers 722 of a wavelength conversion member 700-8 may include a plurality of sub-wavelength conversion layers. The plurality of sub-wavelength conversion layers may be disposed to be spaced apart from each other by a predetermined distance. For example, each of the plurality of sub-wavelength conversion layers may be densely disposed on a corresponding light source of the plurality of light sources 520, respectively. Accordingly, the shape of the recess pattern of a first substrate 712 may correspond to a shape of the plurality of sub-wavelength conversion layers.

Figure 14:
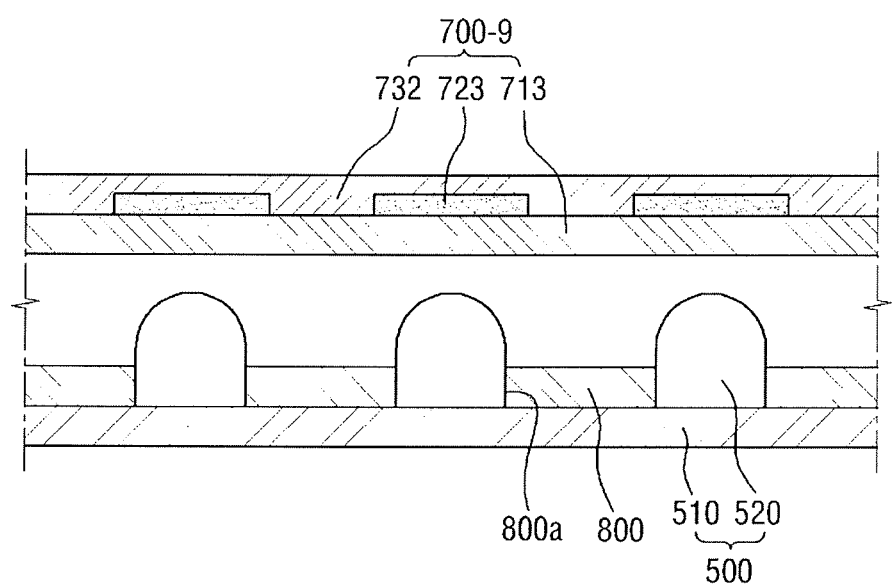

FIG. 14 is a cross-sectional view of a backlight assembly according to an exemplary embodiment of the present invention. The same reference numerals in FIG. 14 may refer to substantially the same elements as the elements illustrated in the above-described drawings, and duplicate explanation thereof may be omitted.

Referring to FIG. 14, a first substrate 713 of a wavelength conversion member 700-9 need not be patterned. A second substrate 732 may be patterned. For example, the second substrate 732 may include a plurality of recess patterns, and a plurality of wavelength conversion layers 723 may be disposed on the plurality of recess patterns, respectively. The wavelength conversion member 700-9 having the above-described shape may be formed by a film lamination process. According to an exemplary embodiment of the present invention, the wavelength conversion layers 723 may be pattern-spread on the first substrate 713, which includes a flexible film material. A second substrate 732, which may include the recess patterns and may include a same material as the first substrate 713, may be disposed on the first substrate 713. For example, the recess patterns of the second substrate 732 and the wavelength conversion layers 723 of the first substrate 713 may overlap each other.

Figure 15:
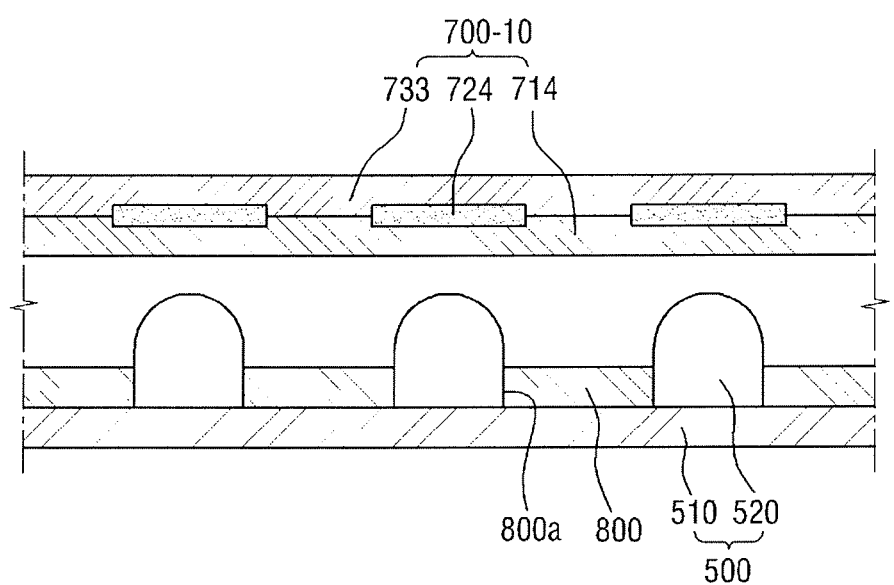

FIG. 15 is a cross-sectional view of a backlight assembly according to an exemplary embodiment of the present invention. The same reference numerals in FIG. 15 may refer to substantially the same elements as the elements illustrated in the above-described drawings, and duplicate explanations thereof may be omitted.

Referring to FIG. 15, a first substrate 714 and a second substrate 733 of a wavelength conversion member 700-10 may include recess patterns. The recess pattern disposed in the first substrate 714 and the recess pattern disposed in the second substrate 733 may face each other. Accordingly, the wavelength conversion layer 724 may be surrounded by the recess pattern of the first substrate 714 and the recess pattern of the second substrate 733.

Figure 16:
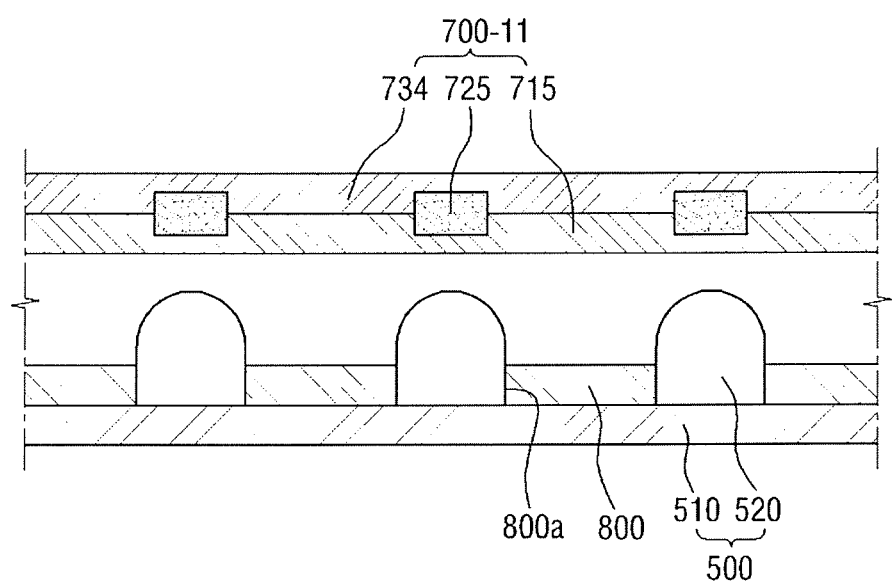

FIG. 16 is a cross-sectional view of a backlight assembly according to an exemplary embodiment of the present invention. For convenience in explanation, the same reference numerals are used for substantially the same elements as the elements illustrated in the above-described drawings, and the duplicate explanation thereof will be omitted.

Referring to FIG. 16, a plurality of wavelength conversion layers 725 of a wavelength conversion member 700-11 may be disposed on center parts of the plurality of light sources 520, respectively, but need not be formed on the edge parts thereof. For example, a first substrate 715 and a second substrate 734 may include recess patterns, and the recess patterns may be formed on the center parts of each of the light sources of the plurality of light sources 520. According to an exemplary embodiment of the present invention, when the plurality of light sources 520 emit blue light and the plurality of wavelength conversion layers 725 convert the wavelength of light into a longer wavelength, light that passes through the plurality of wavelength conversion layers 725 may become yellow, and light that passes between the plurality of wavelength conversion layers 725 may remain blue. Accordingly, light having two colors may be mixed, and white light may be emitted onto the display panel.

Figure 17:
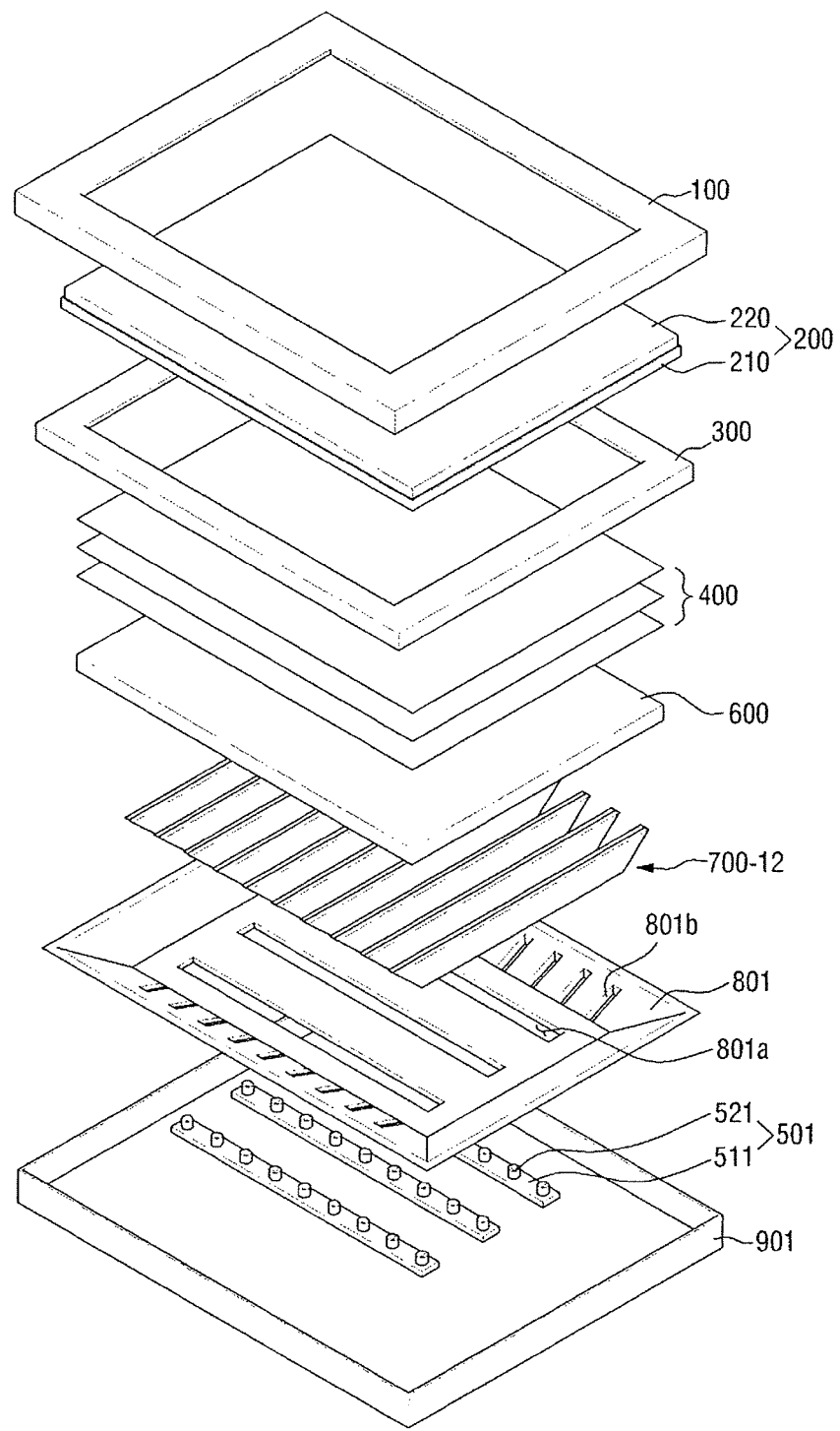
FIG. 17 is an exploded perspective view of a display device according to an exemplary embodiment of the present invention.

FIG. 17 is an exploded perspective view of a display device according to an exemplary embodiment of the present invention. The same reference numerals in FIG. 17 may refer to the same elements as the elements illustrated in the above-described drawings, and duplicate explanation thereof may be omitted.

Referring to FIG. 17, a light source portion 501 may include a plurality of circuit boards 511 and a plurality of light sources 521.

The plurality of circuit boards 511 may have a bar shape. The plurality of circuit boards 511 may be disposed parallel to each other. The plurality of circuit boards 511 may be disposed on the same plane. In FIG. 17, three circuit boards of the plurality of circuit boards 511 are illustrated, but the number of circuit boards is not limited thereto.

Each of the light sources of the plurality of light sources 521 may be disposed on a corresponding circuit board of the plurality of circuit boards 511. According to an exemplary embodiment of the present invention, parts of the light sources of the plurality of light sources 521 may be disposed in a line on the circuit board of the plurality of circuit boards 511 and may be spaced apart from each other, but are not limited thereto. The light sources of the plurality of light sources 521 may be disposed on the same plane.

Each of the light sources of the plurality of light sources 521 may include a side emitting type lens. The light generated from the plurality of light sources 521 may be emitted from an upper side of the plurality of light sources 521. For example, a backlight assembly that is included in the display device according to an exemplary embodiment of the present invention may be a direct type backlight assembly like the display device of FIG. 1, or may be a side view type backlight assembly. According to an exemplary embodiment of the present invention (e.g., the display device illustrated in FIG. 19), the plurality of light sources 521 may emit light in left and right directions.

A plurality of wavelength conversion members 700-12 may be disposed on the light source portion 501 and may be spaced apart from each other. The plurality of wavelength conversion members 700-12 will be described in more detail below.

A reflective plate 801 may be disposed between the light source portion 501 and the plurality of wavelength conversion members 700-12. The reflective plate 801 may include a reflective material, such as a metal, and may be a container that includes slant side walls. The reflective plate 801 may include a plurality of insertion holes 801a in which the plurality of light sources 521 may be disposed. Each of the insertion holes of the plurality of insertion holes 801a may be an elongated hole and may correspond to a circuit board of the plurality of circuit boards 511. The insertion holes of the plurality of insertion holes 801a may be disposed in a line and may be spaced apart from each other. The reflective plate 801 may include a plurality of grooves 801b in which the plurality of wavelength conversion members 700-12 may be disposed. The plurality of grooves 801b may be formed on an inner wall of the reflective plate 801. For example, the length of each of the grooves of the plurality of grooves 801b may be smaller than a height of a side wall of the reflective plate 801.

When the reflective plate 801 includes the plurality of grooves 801b that fix the plurality of wavelength conversion members 700-12, a bottom chassis 901 need not include such grooves, but the display device is not limited thereto. The bottom chassis 901 or the mold frame 300 may include grooves for fixing the plurality of wavelength conversion members 700-12.

Figure 18:
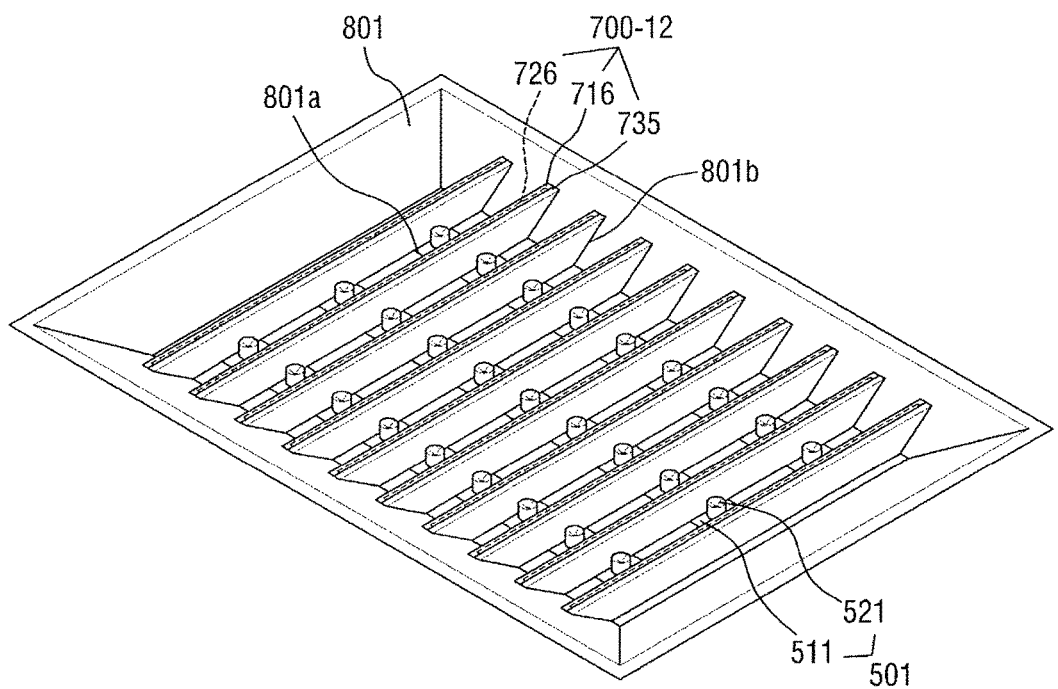
FIG. 18 is a perspective view of a backlight assembly of the display device of FIG. 17.
Figure 19:
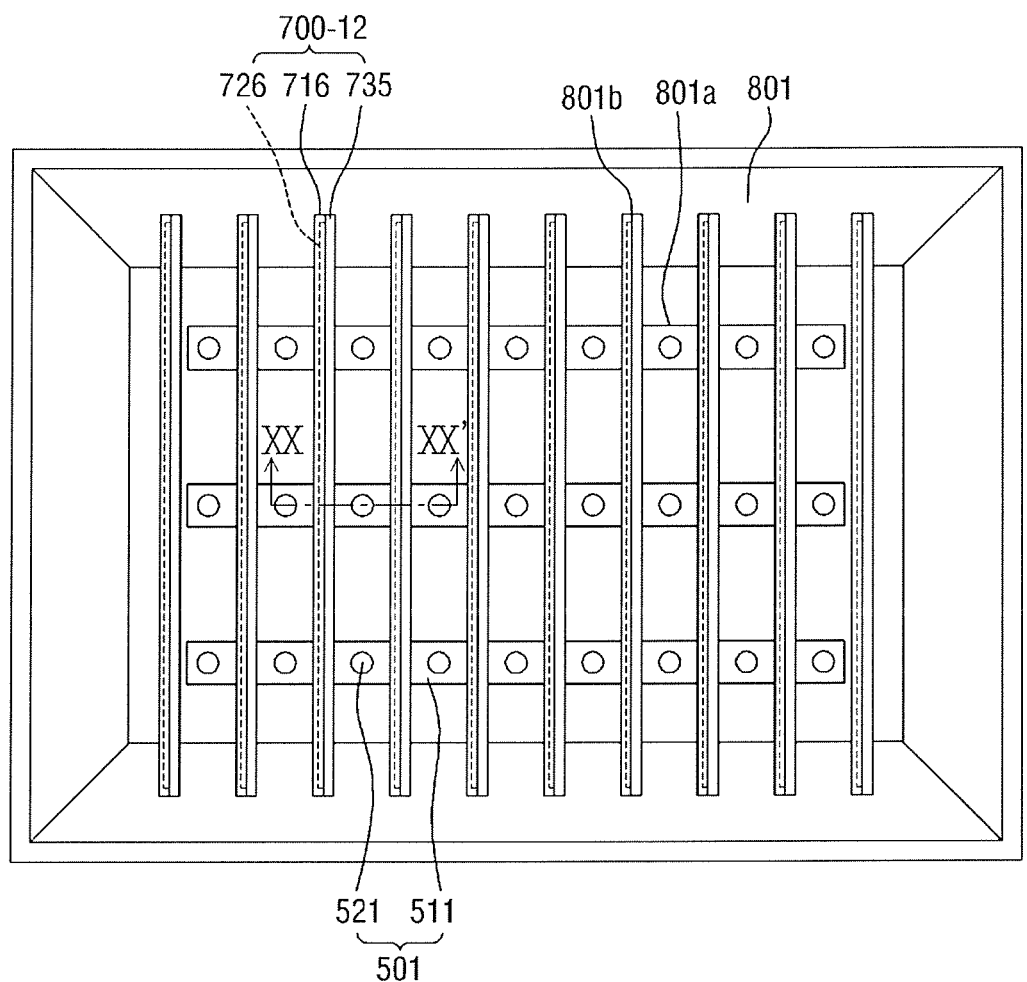
FIG. 19 is a plan view of the backlight assembly of FIG. 18.

Hereinafter, the plurality of wavelength conversion members 700-12 of the backlight assembly (e.g., the backlight assembly of the display device of FIG. 1) will be described in more detail with reference to FIGS. 18 to 20. FIG. 18 is a perspective view of a backlight assembly of the display device of FIG. 17. FIG. 19 is a plan view of the backlight assembly of FIG. 18, and FIG. 20 is a cross-sectional view taken along line XX-XX' of FIG. 19.

Figure 20:
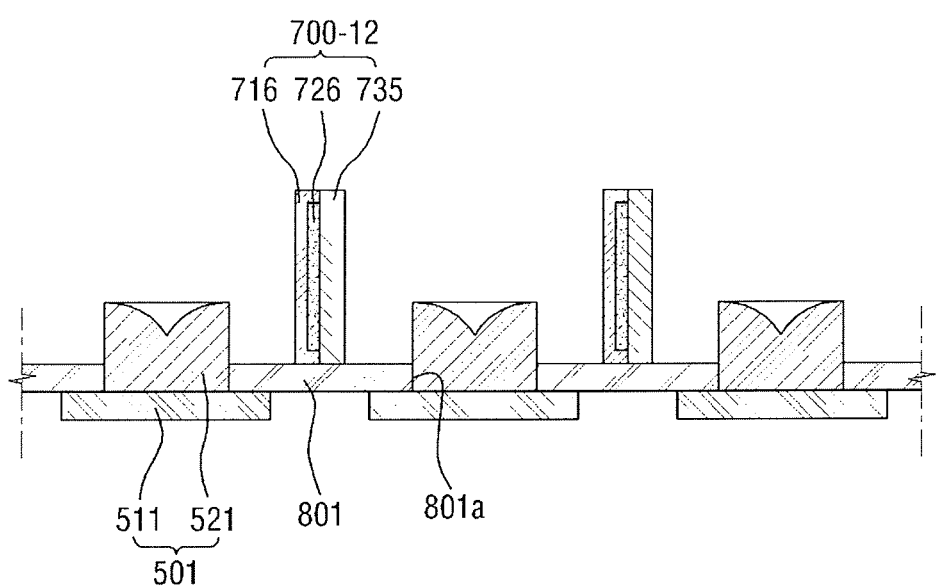
FIG. 20 is a cross-sectional view taken along line XX-XX' of FIG. 19.

Referring to FIGS. 18 to 20, the wavelength conversion members of the plurality of wavelength conversion members 700-12 may have a plate shape that extends in one direction. According to an exemplary embodiment of the present invention, each of the wavelength conversion members of the plurality of wavelength conversion members 700-12 may have a plate shape that extends in a direction that is parallel to a short side of the display panel 200, but is not limited thereto. The wavelength conversion members of the plurality of wavelength conversion members 700-12 may have a plate shape that extends in a direction that is parallel to a long side of the display panel 200.

The wavelength conversion members of the plurality of wavelength conversion members 700-12 may be disposed parallel to each other and may be spaced apart from each other. According to an exemplary embodiment of the present invention, the gap distance between adjacent wavelength conversion members of the plurality of wavelength conversion members 700-12 may be constant.

The wavelength conversion members of the plurality of wavelength conversion members 700-12 may be disposed between the light sources of the plurality of light sources 521. According to an exemplary embodiment of the present invention, the light sources of the plurality of light sources 521 may be disposed in a matrix, and each of the wavelength conversion members of the plurality of wavelength conversion members 700-12 may be disposed between two adjacent rows or two adjacent columns of the matrix, but are not limited thereto. The wavelength conversion members of the plurality of wavelength conversion members 700-12 may be disposed in a lattice and may surround the respective light sources of the plurality of light sources 521.

Each wavelength conversion member of the plurality of wavelength conversion members 700-12 may include a first substrate 716 including a recess pattern, a wavelength conversion layer 726 disposed in the recess pattern, and a second substrate 735 disposed on the wavelength conversion layer 726. For example, the wavelength conversion layer 726 may be interposed between the first substrate 716 and the second substrate 735, but is not limited thereto. As illustrated in FIG. 1, for example, a plurality of wavelength conversion layers 726 may be interposed between the first substrate 716 and the second substrate 735.

An interface between the second substrate 735 and the wavelength conversion layer 726 of the wavelength conversion member 700-12 may be perpendicular to a plane on which the plurality of light sources 521 are disposed. In an exemplary embodiment, the light sources of the plurality of light sources 521 and the wavelength conversion members of the plurality of wavelength conversion members 700-12 need not overlap each other in plan view. The height of each wavelength conversion member of the plurality of wavelength conversion members 700-12 may be higher than the height of each of the light sources of the plurality of light sources 521.

As described above, in the backlight assembly in the display device according to an exemplary embodiment of the present invention, light that is emitted from the light source portion 501 may be emitted from the upper sides of the light sources of the plurality of light sources 521 and may pass through the wavelength conversion members of the plurality of wavelength conversion members 700-12 disposed on side parts of the light sources of the plurality of light sources 521. Light that has passed through the wavelength conversion members of the plurality of wavelength conversion members 700-12 may be wavelength-converted and transferred to the diffusion plate 600. For example, when the height of each of the wavelength conversion members of the plurality of wavelength conversion members 700-12 is higher than the height of each of the light sources of the plurality of light sources 521, light that is emitted from the upper side of the light sources of the plurality of light sources 521 may be totally wavelength-converted.

Figure 21:
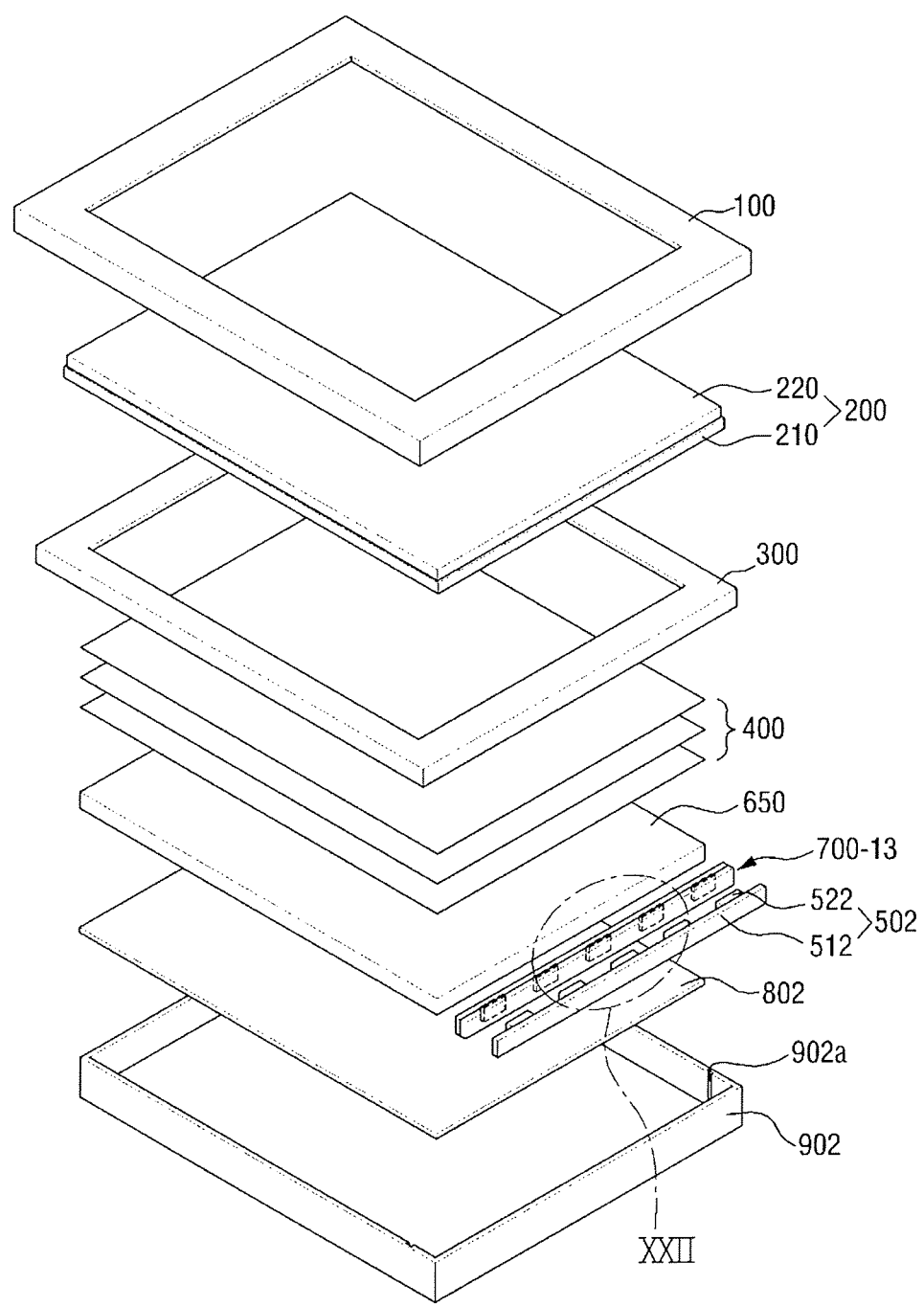
FIG. 21 is an exploded perspective view of a display device according to an exemplary embodiment of the present invention.
Figure 22:
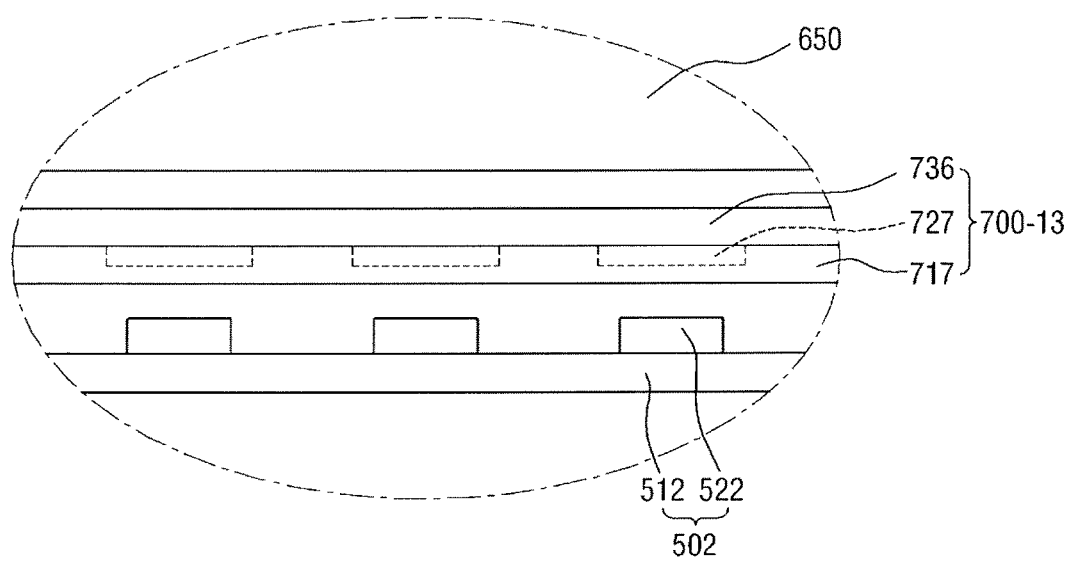
FIG. 22 is an enlarged plan view of a portion XXII in FIG. 21.

FIG. 21 is an exploded perspective view of a display device according to an exemplary embodiment of the present invention, and FIG. 22 is an enlarged plan view of a portion XXII in FIG. 21. The same reference numerals in FIGS. 21 and 22 may refer to substantially the same elements as the elements illustrated in the above-described drawings, and duplicate explanation thereof may be omitted.

Referring to FIGS. 21 and 22, a backlight assembly in a display device according to an exemplary embodiment of the present invention may be an edge type backlight assembly.

The edge type backlight assembly may include a light guide plate 650 that is disposed on the lower part of the display panel 200. The light guide plate 650 may guide light that is emitted from the light source portion 502 and may transfer the guided light to the display panel 200.

The light guide plate 650 may include a transparent material. According to an exemplary embodiment of the present invention, the light guide plate 650 may include polymethyl-methacrylate (PMMA), but is not limited thereto. The light guide plate 650 may include any desired transparent materials capable of guiding light. The light guide plate 650 may include a rigid material, but is not limited thereto. The light guide plate 650 may include a flexible material. The light guide plate 650 may have a cuboidal plate shape, but is not limited thereto. The light guide plate 650 may have any desired shape.

The light source portion 502 may be disposed on a side surface of the light guide plate 650, but is not limited thereto. The light source portion 502 may be disposed on side parts that face each other or all side parts of the light guide plate 650. The light source portion 502 may emit light, which may be transferred to the display panel 200, and to the light guide plate 650.

The light source portion 502 may include a circuit board 512 and a plurality of light sources 522. The circuit board 512 may have a bar shape. A surface of the circuit board 512 may be parallel to a side surface of the light guide plate 650 that faces the circuit board 512. The plurality of light sources 522 may be mounted on the surface of the circuit board 512 that faces the light guide plate 650. The light sources of the plurality of light sources 522 may be disposed in a line and may be spaced apart from each other by a predetermined distance. The plurality of light sources 522 may emit light in the direction of the light guide plate 650.

A wavelength conversion member 700-13 may be interposed between the light guide plate 650 and the light source portion 502. The wavelength conversion member 700-13 may include a first substrate 717 including a plurality of recess patterns, a plurality of wavelength conversion layers 727 disposed in the plurality of recess patterns, and a second substrate 736 disposed on the plurality of wavelength conversion layers 727. The wavelength conversion layers of the plurality of wavelength conversion layers 727 may each correspond to light sources of the plurality of light sources 522, respectively. The wavelength conversion member 700-13 may be disposed and fixed in a groove 902a disposed on the inside of a side wall of a bottom chassis 902.

A reflective plate 802 may be interposed between the light guide plate 650 and the bottom chassis 902. The reflective plate 802 may be a flat type plate that may include a reflective material.

As described above, the wavelength conversion members 700, and 700-1 to 700-13 according to exemplary embodiments of the present invention may be applied to the direct type backlight assembly including the top-view type, the side-view type and the edge type backlight assembly.

While the present invention has been particularly shown and described with reference to exemplary embodiments thereof, it will be understood by those of ordinary skill in the art that various changes in form and detail may be made therein without departing from the spirit and scope of the present invention.

What is claimed is:

1. A backlight assembly, comprising:
a plurality of light sources configured to emit light; and
a plurality of wavelength conversion members, wherein each wavelength conversion member is disposed to a side of the plurality of light sources, wherein each of the plurality of wavelength conversion members is configured to convert a wavelength of light emitted from the plurality of light sources,
a reflective plate comprising a plurality of insertion holes and a plurality of fixing grooves, wherein the reflective plate comprises slanted sidewalls, wherein the plurality of fixing grooves are formed in the slanted sidewalls of the reflective plate, wherein the plurality of light sources are disposed in the plurality of insertion holes, and wherein the plurality of wavelength conversion members are disposed in the plurality of fixing grooves,
wherein each of the wavelength conversion members comprises:
a first substrate;
a second substrate disposed on the first substrate, wherein the first substrate comprises a recessed pattern; and
a wavelength conversion layer disposed and sealed in the recessed pattern,
wherein a first side of the wavelength conversion layer faces a side of the second substrate facing the first substrate, wherein other sides of the wavelength conversion layer are surrounded by the first substrate, and wherein a second side of the wavelength conversion layer facing away from the second substrate faces a side surface of at least one light source of the plurality of light sources.

2. The backlight assembly of claim 1, wherein the wavelength conversion layer comprises quantum dots.

3. The backlight assembly of claim 1, wherein a height of each of the plurality of wavelength conversion members is higher than a height of each of the plurality of light sources.

4. The backlight assembly of claim 1, wherein the plurality of light sources is disposed in a matrix, and
each of the plurality of wavelength conversion members is disposed between adjacent rows or adjacent columns of the matrix.

5. The backlight assembly of claim 1, wherein each of the wavelength conversion layers has a plate shape.

6. A backlight assembly, comprising:
a plurality of light sources configured to emit light;
a plurality of wavelength conversion members, wherein each wavelength conversion member is disposed to a side of the plurality of light sources, wherein each of the plurality of wavelength conversion members is configured to convert a wavelength of light emitted from the plurality of light sources; and
a reflective plate comprising a plurality of insertion holes and a plurality of fixing grooves, wherein the plurality of light sources are disposed in the plurality of insertion holes, wherein the plurality of wavelength conversion members are disposed in the plurality of fixing grooves, wherein the reflective plate comprises slanted sidewalls in which the fixing grooves are formed, wherein an uppermost portion of the slanted sidewalls is positioned above upper surfaces of the light sources, and wherein an uppermost portion of the plurality of wavelength conversion members is positioned below the uppermost portion of the slanted sidewalls,
wherein each of the wavelength conversion members comprises:
a first substrate;
a second substrate disposed on the first substrate, wherein the first substrate comprises a recessed pattern; and
a wavelength conversion layer, wherein the wavelength conversion layer is disposed in the recessed pattern,
wherein the recessed pattern has a thickness of from ¼ to ¾ of a thickness of the first substrate,
wherein the first and second substrates are in direct contact with the reflective plate, and wherein the wavelength conversion layer is spaced apart from the reflective plate;
wherein a first side of the wavelength conversion layer faces a side of the second substrate facing the first substrate, wherein other sides of the wavelength conversion layer are surrounded by the first substrate, and wherein a second side of the wavelength conversion layer facing away from the second substrate faces a side surface of at least one light source of the plurality of light sources.

7. The backlight assembly of claim 6, wherein each of the wavelength conversion layers has a plate shape.

8. The backlight assembly of claim 1, wherein the recessed pattern has a thickness of from ¼ to ¾ of a thickness of the first substrate.

9. The backlight assembly of claim 1, wherein the first side of the wavelength conversion layer facing the side of the second substrate is in direct contact with the second substrate, and wherein other sides of the wavelength conversion layer are in direct contact with the first substrate in the recessed pattern.

10. The backlight assembly of claim 1, wherein at least a portion of the wavelength conversion layer overlaps at least a portion of the side surface of the at least one light source of the plurality of light sources along a direction perpendicular to the side surface of the at least one light source of the plurality of light sources.

11. The backlight assembly of claim 10, wherein the at least one light source of the plurality of light sources comprises a side emitting lens configured to direct light from the side surface of the at least one light source of the plurality of light sources toward the second side of the wavelength conversion layer facing away from the second substrate.

12. The backlight assembly of claim 6, wherein at least one of the insertion holes of the plurality of insertion holes is an elongated hole, and wherein at least two light sources of the plurality of light sources are disposed in the elongated hole.

13. The backlight assembly of claim 1, wherein the wavelength conversion layer includes four side surfaces perpendicular to the first side and the second side and connecting the first side and the second side of the wavelength conversion layer, and each of the four side surfaces is completely overlapped with the recessed pattern.

14. The backlight assembly of claim 1, wherein uppermost portions of the fixing grooves are formed below an uppermost portion of the slanted sidewalk of the reflective plate.

15. The backlight assembly of claim 1, wherein each of the insertion holes has an elongated shape dimensioned to receive two or more light sources of the plurality of light sources, and wherein the wavelength conversion members extend perpendicularly across the insertion holes to separate the two or more light sources of the plurality of light sources from each other.

* * * * *